(12) United States Patent
Kim et al.

(10) Patent No.: US 8,741,665 B2
(45) Date of Patent: Jun. 3, 2014

(54) METHOD OF MANUFACTURING SEMICONDUCTOR MODULE

(75) Inventors: Sangyoung Kim, Asan-si (KR); Jaereyun Jung, Yongin-si (KR); Sanggug Lee, Yongin-si (KR); Jongtae Park, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 198 days.

(21) Appl. No.: 13/350,966

(22) Filed: Jan. 16, 2012

(65) Prior Publication Data

US 2012/0196386 A1 Aug. 2, 2012

(30) Foreign Application Priority Data

Feb. 1, 2011 (KR) ........................ 10-2011-0009984

(51) Int. Cl.
*H01L 21/66* (2006.01)

(52) U.S. Cl.
USPC ................................ 438/14; 438/15; 438/113

(58) Field of Classification Search
USPC ................ 438/14, 15, 17, 108, 113, 114, 118
See application file for complete search history.

(56) References Cited

U.S. PATENT DOCUMENTS

| 5,535,101 | A | * | 7/1996 | Miles et al. | 361/808 |
| 5,998,860 | A | * | 12/1999 | Chan et al. | 257/679 |
| 6,815,712 | B1 | * | 11/2004 | Kline | 257/48 |
| 2007/0269911 | A1 | * | 11/2007 | Co et al. | 438/17 |
| 2007/0288805 | A1 | * | 12/2007 | Charlton et al. | 714/710 |

FOREIGN PATENT DOCUMENTS

| KR | 20-1995-0004211 | 5/1995 |
| KR | 100299304 | 6/2001 |
| KR | 1020050023842 | 3/2005 |

* cited by examiner

*Primary Examiner* — Kevin M Picardat
(74) *Attorney, Agent, or Firm* — F. Chau & Associates, LLC (57) ABSTRACT

A method of manufacturing a semiconductor module is provided. The method includes forming semiconductor chips on a bare substrate, performing a burn-in process on the bare substrate including the semiconductor chips, sorting semiconductor chips that exceed a predetermined level of operability determined by testing electrical driving in the semiconductor chips on the burned-in bare substrate, separating the semiconductor chips from one another by cutting the bare substrate, and directly mounting the module semiconductor chips on a module substrate.

20 Claims, 7 Drawing Sheets

METHOD OF MANUFACTURING SEMICONDUCTOR MODULE

CROSS-REFERENCE TO RELATED APPLICATION

This U.S. non-provisional patent application claims priority under 35 U.S.C. §119 to Korean Patent Application No. 10-2011-0009984, filed on Feb. 1, 2011, the entire contents of which are hereby incorporated by reference.

BACKGROUND

The present inventive concept relates to methods of manufacturing semiconductor modules, and more particularly, to a method of manufacturing a semiconductor module using a wafer level package.

Semiconductor modules may be manufactured through a fabrication process (FAB) for forming semiconductor chips on a substrate, an electrical die sorting (EDS) process for testing electrical characteristics of the semiconductor chips, a process of cutting the substrate to divide and assemble the semiconductor chips, a process of testing electrical characteristics of separated semiconductor chips and a process of mounting the separated semiconductor chips on a module substrate. Since semiconductor modules are manufactured through various processes, manufacturing time increases and production costs increase due to higher facility and material investments.

SUMMARY

A method of manufacturing a semiconductor module, in accordance with an embodiment of the inventive concept, includes forming semiconductor chips on a bare substrate, performing a burn-in process on the bare substrate including the semiconductor chips, sorting semiconductor chips that exceed a predetermined level of operability determined by testing electrical signal transmission in the semiconductor chips on the burned-in bare substrate, separating the semiconductor chips from one another by cutting the bare substrate, and directly mounting the semiconductor chips on a module substrate A method of manufacturing a semiconductor device, in accordance with an embodiment of the inventive concept, includes forming semiconductor chips on a first substrate, performing a burn-in process on the first substrate including the semiconductor chips, sorting operational semiconductor chips from failed semiconductor chips after the burn-in process, separating the sorted semiconductor chips from one another by cutting the first substrate, and mounting the semiconductor chips on a second substrate.

The semiconductor chips may be mounted on respective opposite sides of the second substrate.

The method may further comprise forming a protection pattern to cover the semiconductor chips on the second substrate. The protective pattern may include one of an epoxy molding compound or an aluminum alloy.

The second substrate may include a plurality of tabs formed below the semiconductor chips, wherein the tabs transmit and receive electric signals to and from the semiconductor chips.

The semiconductor chips may be spaced apart from each other along a first direction, and include a plurality of conductive patterns positioned between adjacent semiconductor chips.

The method may further comprise forming a plurality of conductive bumps between each semiconductor chip and the second substrate, wherein the semiconductor chips are spaced apart from each other along a first direction on the second substrate, and the plurality of conductive bumps are formed on a side of each semiconductor chip in a row extending in a second direction perpendicular to the first direction.

The protection pattern may fill in portions between adjacent conductive bumps.

BRIEF DESCRIPTION OF THE FIGURES

The foregoing and other features of the inventive concept will be apparent from the more particular description of embodiments of the inventive concept, as illustrated in the accompanying drawings in which like reference characters may refer to the same or similar parts throughout the different views. The drawings are not necessarily to scale, emphasis instead being placed upon illustrating the principles of the embodiments of the inventive concept. In the drawings, the thickness of layers and regions may be exaggerated for clarity.

DETAILED DESCRIPTION OF THE EMBODIMENTS

Exemplary embodiments of the inventive concept will be described below in more detail with reference to the accompanying drawings. The embodiments of the inventive concept may, however, be embodied in different forms and should not be constructed as limited to the embodiments set forth herein. Like reference numerals may refer to like elements throughout the specification.

In the drawings, the thickness of layers and regions may be exaggerated for clarity. It will also be understood that when an element such as a layer, region or substrate is referred to as being "on" or "onto" another element, it may lie directly on the other element or intervening elements or layers may also be present.

Hereinafter, referring to drawings, the embodiments of the inventive concept will be described in further detail.

Figure 1:
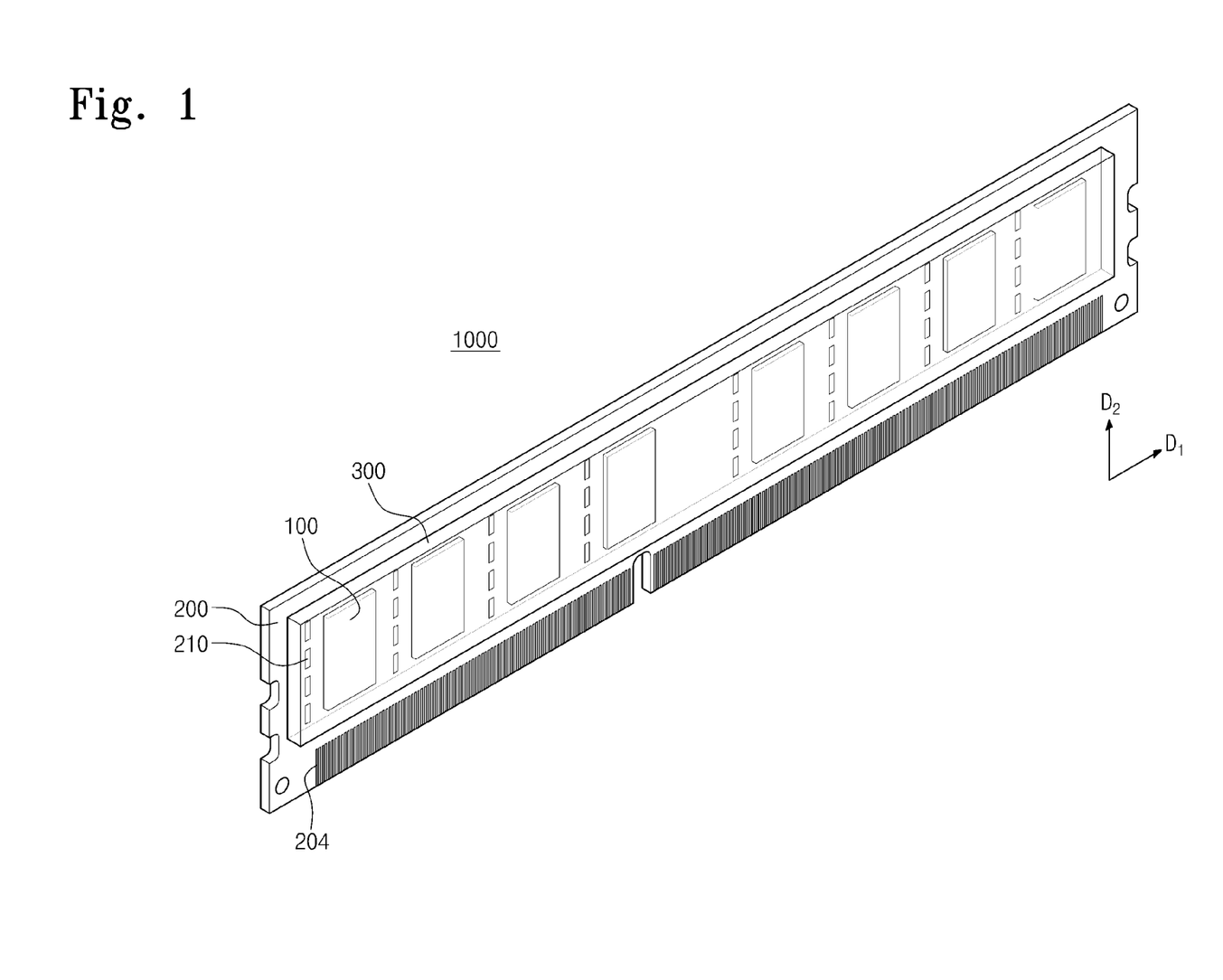
FIG. 1 is a perspective view of a semiconductor module in accordance with some embodiments of the inventive concept.
Figure 2:
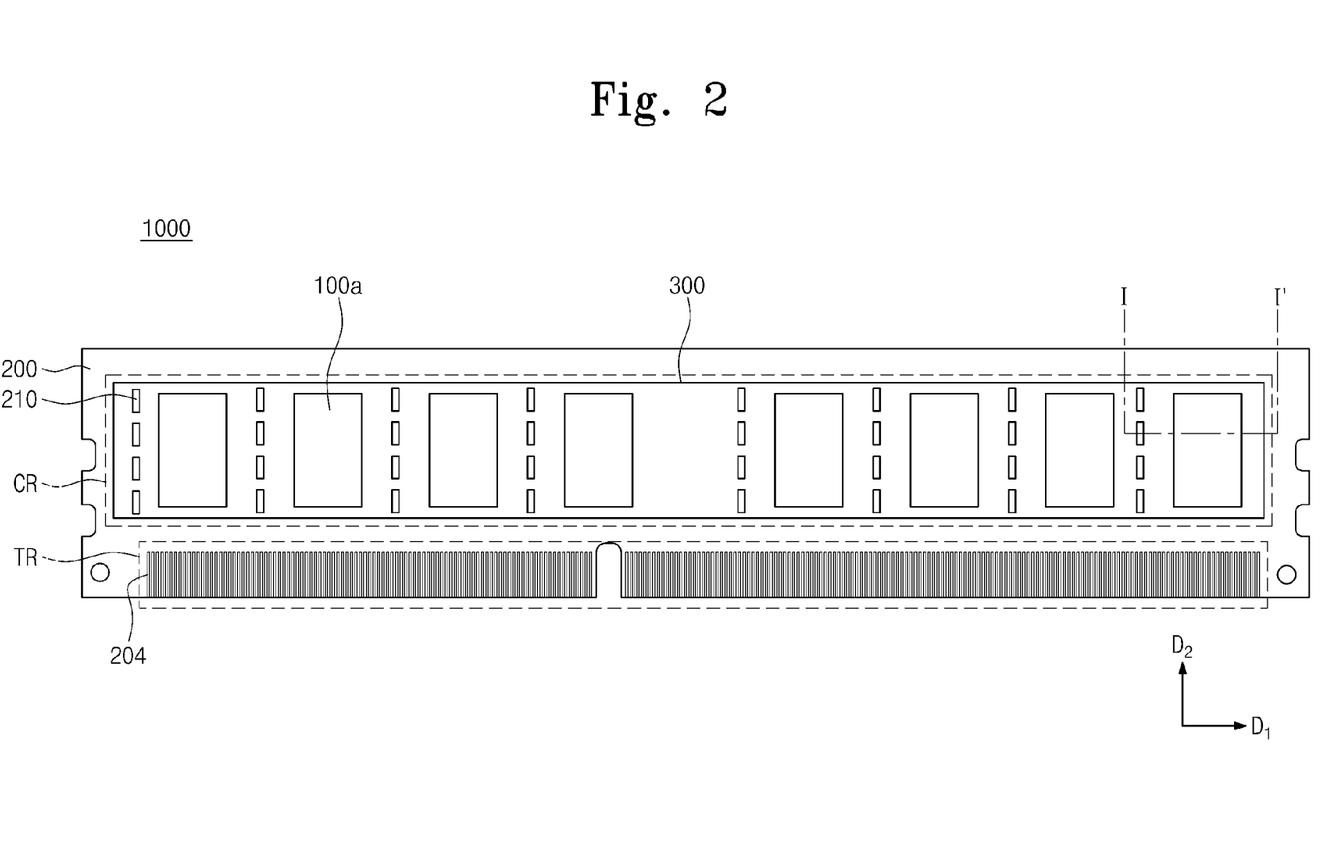
FIG. 2 is a plan view of a semiconductor module in accordance with some embodiments of the inventive concept.
Figure 3:
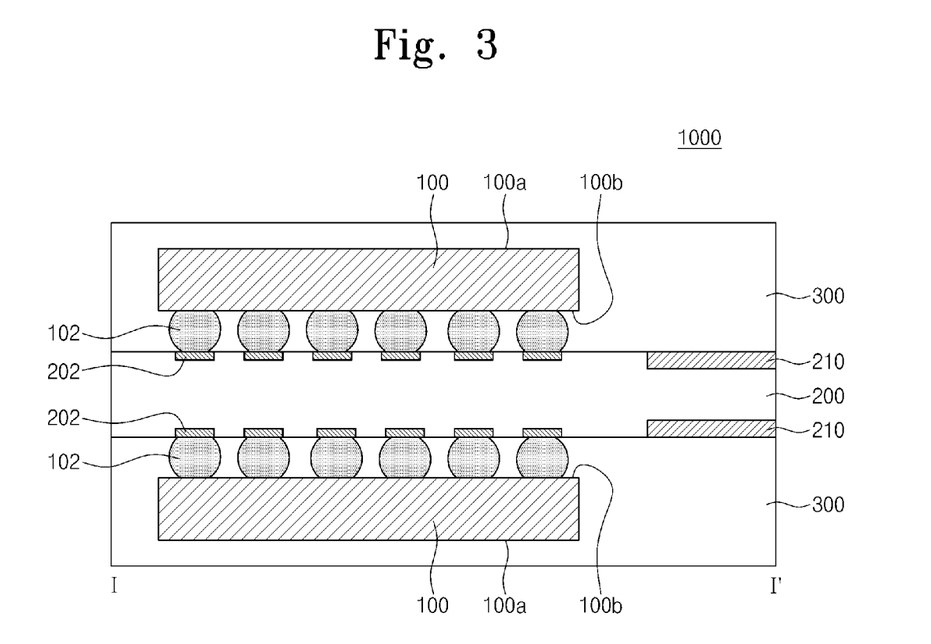
FIG. 3 is a cross sectional view of a semiconductor module in accordance with some embodiments of the inventive concept.
Figure 4:
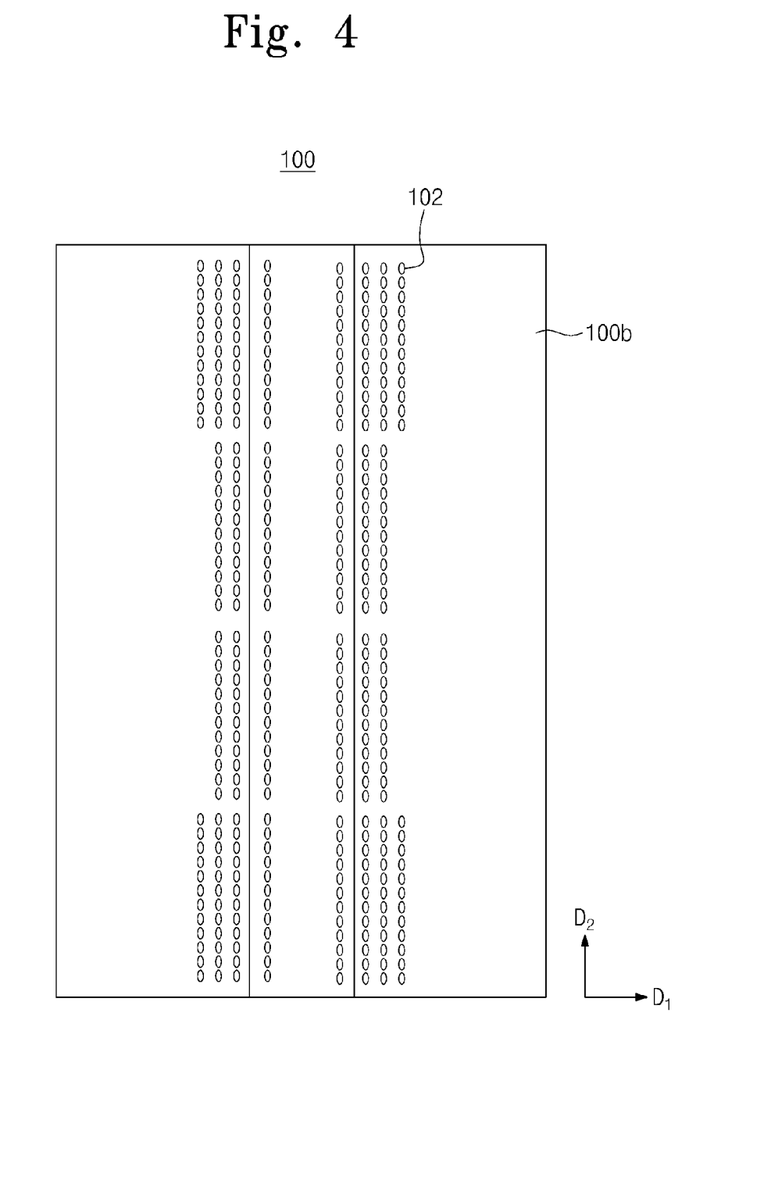
FIG. 4 is a top plan view of a semiconductor chip in accordance with some embodiments of the inventive concept.

FIG. 1 is a perspective view of a semiconductor module in accordance with some embodiments of the inventive concept. FIG. 2 is a plan view of a semiconductor module in accordance with some embodiments of the inventive concept. FIG. 3 is a cross sectional view of a semiconductor module in accordance with some embodiments of the inventive concept. FIG. 4 is a top plan view of a semiconductor chip in accordance with some embodiments of the inventive concept.

FIG. 2 is a front side plan view of the semiconductor module of FIG. 1. FIG. 3 is a cross sectional view taken along the line I-I' of the semiconductor module of FIG. 2. FIG. 4 is a top plan view illustrating a back side of a semiconductor chip of FIG. 1.

Referring to FIGS. 1 through 3, a semiconductor module 1000 includes a module substrate 200, a plurality of semiconductor chips 100 mounted on the module substrate 200, a plurality of conductive patterns 210 disposed adjacent and/or between the semiconductor chips 100, tabs 204 disposed under the module substrate 200 and a protection pattern 300 for protecting the semiconductor chips 100 on the module substrate 200.

In accordance with an embodiment of the inventive concept, the module substrate 200 is a printed circuit board (PCB). For instance, the module substrate 200 extends in a first direction D1. Also, referring to FIG. 2, the module substrate 200 includes a chip region CR in which the semiconductor chips 100 are mounted and a tab region TR in which the tabs 204 are mounted. In accordance with an embodiment of the inventive concept, chip regions CR and tab regions TR are formed on front and rear sides of the module substrate 200.

In accordance with an embodiment of the inventive concept, the plurality of semiconductor chips 100 are mounted in the chip region CR at front and rear sides of the module substrate 200. Referring to FIGS. 1 and 2, the module substrate 200 extends in the first direction D1 and the plurality of semiconductor chips 100 are disposed to be spaced apart from each other along the first direction D1. Also, as can be seen from FIG. 3, the semiconductor chips 100 and the protection patterns 300 are formed on opposite front and rear sides of the module substrate 200.

According to an embodiment of the inventive concept, each of the semiconductor chips 100 is a wafer level package and is electrically mounted on the module substrate 200 through bumps 102. In an embodiment, the plurality of semiconductor chips 100 are mounted on a component substrate (not shown) by first bumps (not shown) and the component substrate is mounted on the module substrate 200 by second bumps (not shown). An arrangement structure of the first bumps may be different from an arrangement structure of the second bumps.

Referring to FIG. 3, in accordance with an embodiment of the inventive concept, the semiconductor chips 100 are directly mounted on the module substrate 200 without the component substrate. Thus, an arrangement structure of the bumps 102 between the semiconductor chips 100 and the module substrate 200 may be different from an arrangement structure of the second bumps. The arrangement structure of the bumps 102 in accordance with the present embodiment is substantially the same as an arrangement structure of the first bumps when the semiconductor chips 100 are mounted on the component substrate.

Referring to FIG. 4, the bumps 102 in accordance with some embodiments of the inventive concept are disposed on a back side 100b of each semiconductor chip 100. According to some embodiments of the inventive concept, the bumps 102 are disposed on the center of the back side 100b of the semiconductor chip 100. Also, the semiconductor chip 100 extends in a second direction D2 perpendicular to the first direction D1 and the bumps 102 are disposed in a row along the second direction D2.

Referring to FIGS. 1 through 3, the plurality of conductive patterns 210 are spaced apart from each other along the first direction D1 and are disposed between the mounted semiconductor chips 100. The conductive patterns 210 are electrically connected to circuits (not shown) formed in the module substrate 200. The conductive patterns 210 are electrically connected to the semiconductor chips 100. Thus, the conductive patterns 210 transmit an electric signal from the outside to the semiconductor chips 100.

The tabs 204 are disposed in the tab region TR of the module substrate 200. The tab region TR is disposed at the bottom of the module substrate 200. The tabs 204 are disposed to be spaced apart from each other along the first direction D1. The tabs 204 transmit electric signals from the outside to the semiconductor chips 100 or from the semiconductor chips 100 to the outside.

The protection pattern 300 is disposed on the sides of the module substrate 200, for example, front and rear sides, on which the semiconductor chips 100 are mounted. The protection pattern 300 extends in the first direction D1. Also, the protection pattern 300 covers front sides 100a of the semiconductor chips 100. In accordance with an embodiment of the inventive concept, the protection pattern 300 includes, for example, an epoxy molding compound (EMC) or an underfill. In accordance with an embodiment of the inventive concept, the protection pattern 300 includes a metal compound, such as, for example, an aluminum compound.

Figure 5:
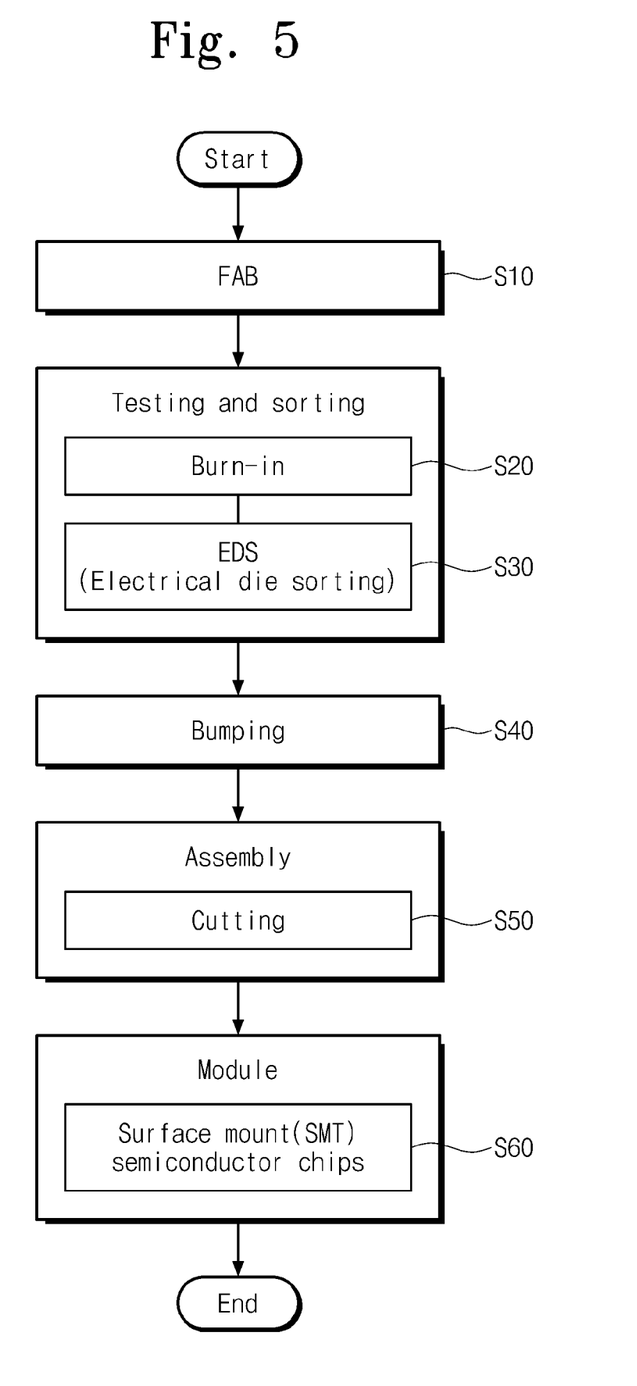
FIG. 5 is a flow chart for describing a method of packaging a semiconductor chip in accordance with some embodiments of the inventive concept.

FIG. 5 is a flow chart for describing a method of packaging a semiconductor chip in accordance with some embodiments of the inventive concept.

Referring to FIGS. 1 through 5, semiconductor chips 100 may be formed on a bare substrate (not shown).

The bare substrate is a semiconductor substrate including, for example, silicon or germanium, a silicon on insulator (SOI) substrate or a germanium on insulator (GOI) substrate. The semiconductor chips 100 are formed on a front side of the bare substrate by performing a plurality of fabrication processes (FAB) (S10). According to an embodiment of the inventive concept, the semiconductor chips on the bare substrate have a flip chip structure.

A burn-in process is performed on the bare substrate including the semiconductor chips 100 (S20). The burn-in process is a process that applies a voltage higher than a voltage driving the semiconductor chips 100 or heats the semiconductor chips 100 at a temperature higher than a room temperature. Semiconductor chips 100 having a failure possibility may be revealed through the burn-in process.

The burn-in process may be performed in a test process after separating the semiconductor chips 100 by cutting the bare substrate. In the present embodiment, however, the burn-in process is performed before cutting the bare substrate, so that semiconductor chips 100 having a failure possibility are revealed before cutting the bare substrate and thereby a subsequent test process may be omitted.

An electrical die sorting (EDS) process is performed on the semiconductor chips 100 of the bare substrate on which the burn-in process was performed (S30). Whether the semiconductor chips 100 electrically operate or not is checked through the EDS process and thereby failed semiconductor chips may be sorted. In accordance with an embodiment of the inventive concept, whether a semiconductor chip is considered operational is determined by testing whether the semiconductor chips operate within a predetermined acceptable range for transmission of electrical signals.

According to an embodiment of the inventive concept, the sorted failed semiconductor chips may be changed to operational semiconductor chips having electrical operating characteristics by performing a re-work process on the failed semiconductor chips. The re-work process may be automatically performed in a chip level module state. According to another embodiment of the inventive concept, the sorted failed semiconductor chips may be changed to operational semiconductor chips having electrical operating characteristics by repairing the failed semiconductor chips in a chip level module state.

Bumps 102 are formed on a back side of the bare substrate including the semiconductor chips 100 (S40). In accordance with an embodiment of the inventive concept, a process of forming the bumps 102 on the back side of the bare substrate is performed in a fabrication process line. As an illustration, the bumps 102 are selectively formed only on the portions of the back side of the bare substrate corresponding to the semiconductor chips 100 sorted into operational semiconductor chips through the EDS process. In accordance with another embodiment of the inventive concept, the bumps 102 are formed on the whole back side of the bare substrate corresponding to both the failed semiconductor chips and operational semiconductor chips.

The semiconductor chips 100 are separated from one another by cutting the bare substrate on which the bumps 102 are formed (S50). This process is performed during an assembly process. An assembly process may be a process in which the semiconductor chips 100 are separated from one another by cutting the bare substrate including the bumps 102, and then the separated semiconductor chips 100 are mounted on a component substrate. However, in the present embodiment, since the separated semiconductor chips 100 are directly mounted on the module substrate 200, a process of mounting the separated semiconductor chips 100 on a component substrate may be omitted.

As described above, failed semiconductor chips are revealed by performing a burn-in process before an EDS process and thereby a test process being performed after an assembly process may be omitted. As a result, the cost and time of a process may be reduced.

According to an embodiment of the inventive concept, before cutting the bare substrate, a back-up process is further performed on a back side of the bare substrate. According to another embodiment of the inventive concept, a back-up process is omitted.

The separated semiconductor chips 100 are respectively mounted on the module substrate 200 respectively (S60), using, for example, a surface mount (SMT) process.

The module substrate 200 includes front and rear sides. In accordance with an embodiment of the inventive concept, the front and rear sides each include a semiconductor chip region CR and a tab region TR. The tab region TR is disposed under the semiconductor chip region CR. The module substrate 200 extends in a first direction D1. The semiconductor chip region CR extends in the first direction D1.

The bumps 102 are disposed on a back side 100b of the semiconductor chip 100. According to some embodiments of the inventive concept, the bumps 102 are disposed at the center of back side 100b of the semiconductor chip 100. Also, in accordance with an embodiment of the inventive concept, the semiconductor chip 100 extends in a second direction D2 perpendicular to the first direction D1 and the bumps 102 are arranged in a row along the second direction D2.

In accordance with an embodiment of the inventive concept, pads 202 corresponding to the bumps 102 are formed in the module substrate 200. After the bumps 102 contact the pads 102, a reflow process may be performed. Through the reflow process, the semiconductor chip 100 is electrically connected to the module substrate 200 through the bumps 102.

Conductive patterns 210 are formed between the semiconductor chips 100. The conductive patterns 210 ARE electrically connected to the semiconductor chips 100 and the module substrate 200. Tabs 204 are formed in the tab region TR of the module substrate 200. The tabs 204 are disposed to be spaced apart from each other in the first direction D1. The tabs 204 transmit electric signals from the outside to the semiconductor chips 100 or from the semiconductor chips 100 to the outside. The tabs 204 are electrically connected to the semiconductor chip 100, the module substrate 200, the conductive patterns 210 and an external device, respectively.

A protection pattern 300 is formed on sides of the module substrate 200, for example, front and rear sides, on which the semiconductor chips 100 are mounted. The protection pattern 300 extends in the first direction D1 and protects the semiconductor chips 100 mounted on the module substrate 200 from the outside environment.

As an illustration, the protection pattern 300 is formed by covering and hardening an epoxy molding compound or an under-fill on front and rear sides of the module substrate 200 on which the semiconductor chips 100 are mounted.

As another illustration, the protection pattern 300 is formed by disposing a pattern including metal or metal compound on front and rear sides of the module substrate 200 on which the semiconductor chips 100 are mounted. For instance, the protection pattern 300 may include an aluminum alloy. An aluminum alloy is a material constituting a heat sink. When using an aluminum alloy as the protection pattern 300, a thermal emission effect of the semiconductor module 1000, including the protection pattern 300, may increase.

Figure 6:
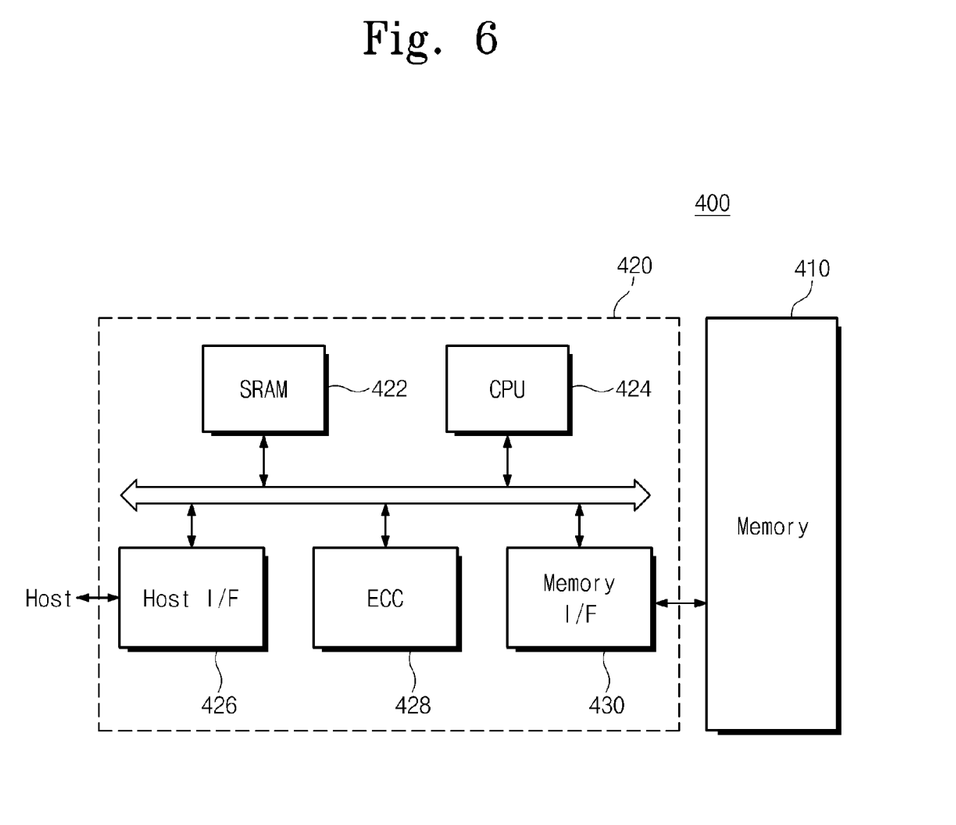
FIG. 6 is a block diagram illustrating a memory card including a semiconductor module in accordance with some embodiments of the inventive concept.

FIG. 6 is a block diagram illustrating a memory card including a semiconductor module in accordance with embodiments of the inventive concept.

Referring to FIG. 6, a semiconductor package in accordance with some embodiments of the inventive concept may be applied to a memory card 400. As an illustration, the memory card 400 includes a memory controller 420 controlling data exchange between a host and a semiconductor memory 410. A static random access memory (SRAM) 422 is used as an operation memory of a central processing unit 424. A host interface 426 includes data exchange protocols of the host connected to the memory card 400. An error correction code 428 detects and corrects errors included in data read from the semiconductor memory 410. A memory interface 430 interfaces with the semiconductor memory 410. The central processing unit 424 performs the control operation for data exchange of the memory controller 420.

The semiconductor memory 410 applied to the memory card 400 includes the semiconductor module manufactured according to embodiments of the inventive concept and thereby the cost of manufacturing the semiconductor module and a manufacturing time may be reduced.

Figure 7:
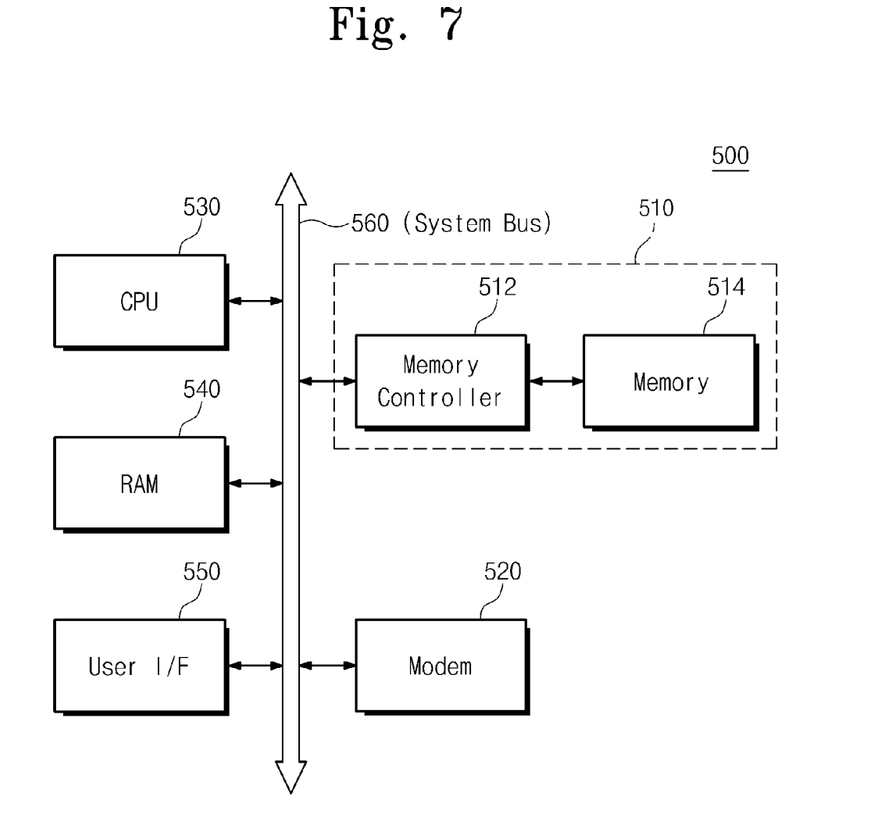
FIG. 7 is a block diagram illustrating an information processing system applying a semiconductor device in accordance with some embodiments of the inventive concept.

FIG. 7 is a block diagram illustrating an information processing system applying a semiconductor device in accordance with some embodiments of the inventive concept.

Referring to FIG. 7, an information processing system 500 includes a semiconductor memory device, for example, a memory system 510 including a resistance variable memory. The information processing system 500 may include, for example, a mobile device or a computer. As an illustration, the information processing system 500 includes a memory system 510, and a modem 520, a central processing unit 530, a RAM 540 and a user interface 550, each of which are electrically connected to a system bus 560. The memory system 510 stores data processed by the central processing unit 530 and/or data received from the outside. The memory system 510 includes a memory 514 and a memory controller 512. The memory system 510 may be, for example, the same as the memory card 400 described with reference to FIG. 6. The information processing system 500 may include a memory card, a solid state disk, a camera image sensor and/or an application chipset. As an illustration, the memory system 510 may be constituted by a solid state disk (SSD). The information processing system 500 may reliably and stably store large amounts of data.

According to embodiments of the inventive concept, a burn-in process is performed before an EDS process and thereby a subsequent test process does not need to be performed. As a result, the cost and a time required to manufacture a semiconductor module may be reduced.

Although embodiments of the present inventive concept have been shown and described, it will be appreciated by those skilled in the art that changes may be made without departing from the principles and spirit of the inventive concept, the scope of which is defined in the appended claims.

What is claimed is:

1. A method of manufacturing a semiconductor module comprising:
   forming semiconductor chips on a bare substrate;
   performing a burn-in process on the bare substrate including the semiconductor chips;
   performing an electrical die sorting on the semiconductor chips formed on the bare substrate, wherein the electrical die sorting determines whether the semiconductor chips formed on the bare substrate exceed a predetermined level of operability or not;
   sorting semiconductor chips that exceed a predetermined level of operability;
   separating the semiconductor chips from one another by cutting the bare substrate; and directly mounting the sorted semiconductor chips on a module substrate.

2. The method of claim 1, wherein the formed bumps are electrically connected to the sorted semiconductor chip on the bare substrate.

3. The method of claim 2, further comprising forming pads on the module substrate to correspond positions where the bumps are formed.

4. The method of claim 2, wherein each of the semiconductor chips extends in a direction and the bumps are formed at a center portion of the semiconductor chip in a row along the extension direction.

5. The method of claim 1, further comprising forming a protection pattern on the semiconductor chips on the module substrate.

6. The method of claim 5, wherein the module substrate extends in a direction, the protection pattern extends in the extension direction of the module substrate and the semiconductor chips are mounted to be spaced apart from one another in the extension direction.

7. The method of claim 6, wherein forming the protection pattern comprises hardening an epoxy molding compound or an under-fill on the module substrate, and covering the module substrate including the semiconductor chips with the protection pattern.

8. The method of claim 6, wherein forming the protection pattern comprises forming an aluminum alloy pattern on the module substrate including the semiconductor chips.

9. The method of claim 1, wherein forming the semiconductor chips on the bare substrate comprises forming the semiconductor chips in a flip chip structure.

10. The method of claim 1, wherein the semiconductor chips are mounted on two sides of the module substrate.

11. The method of claim 10, further comprising forming tabs under the semiconductor chips on the two sides of the module substrate, wherein the tabs transmit and receive electric signals to and from the semiconductor chips.

12. A method for manufacturing a semiconductor device, comprising:
    forming semiconductor chips on a first substrate;
    performing a burn-in process on the first substrate including the semiconductor chips;
    performing an electrical dig sorting on the semiconductor chips formed on the first substrate, wherein the electrical die sorting determines whether the semiconductor chips formed on the first substrate are operational or not;
    sorting operational semiconductor chips from failed semiconductor chips after the electrical die sorting;
    separating the semiconductor chips from one another by cutting the first substrate; and
    mounting the sorted semiconductor chips on a second substrate.

13. The method according to claim 12, wherein the sorted semiconductor chips are mounted on respective opposite sides of the second substrate.

14. The method according to claim 12, further comprising forming a protection pattern to cover the semiconductor chips on the second substrate.

15. The method according to claim 14, wherein the protective pattern includes one of an epoxy molding compound or an aluminum alloy.

16. The method according to claim 12, wherein the second substrate includes a plurality of tabs formed below the semiconductor chips, wherein the tabs transmit and receive electric signals to and from the semiconductor chips.

17. The method according to claim 12, wherein the semiconductor chips are spaced apart from each other along a first direction, and include a plurality of conductive patterns positioned between adjacent semiconductor chips.

18. The method according to claim 12, further comprising forming a plurality of conductive bumps between each semiconductor chip and the second substrate.

19. The method according to claim 18, wherein the semiconductor chips are spaced apart from each other along a first direction on the second substrate, and the plurality of conductive bumps are formed on a side of each semiconductor chip in a row extending in a second direction perpendicular to the first direction.

20. The method according to claim 19, further comprising forming a protection pattern to cover the semiconductor chips on the second substrate, wherein the protection pattern fills in portions between adjacent conductive bumps.

* * * * *